(12) United States Patent
Janakiraman et al.

(10) Patent No.: US 10,774,423 B2
(45) Date of Patent: Sep. 15, 2020

(54) TUNABLE GROUND PLANES IN PLASMA CHAMBERS

(71) Applicant: Applied Materials, Inc., Santa Clara, CA (US)

(72) Inventors: Karthik Janakiraman, San Jose, CA (US); Thomas Nowak, Cupertino, CA (US); Juan Carlos Rocha-Alvarez, San Carlos, CA (US); Mark A. Fodor, Los Gatos, CA (US); Dale R. Du Bois, Los Gatos, CA (US); Amit Bansal, Milpitas, CA (US); Mohamad Ayoub, Los Gatos, CA (US); Eller Y. Juco, San Jose, CA (US); Visweswaren Sivaramakrishnan, Cupertino, CA (US); Hichem M'Saad, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 768 days.

(21) Appl. No.: 14/552,273

(22) Filed: Nov. 24, 2014

(65) Prior Publication Data

US 2016/0145742 A1  May 26, 2016
US 2018/0073142 A9  Mar. 15, 2018

Related U.S. Application Data

(63) Continuation of application No. 13/456,308, filed on Apr. 26, 2012, now abandoned, which is a (Continued)

(51) Int. Cl.
*C23C 16/455* (2006.01)
*C23C 16/458* (2006.01)
(Continued)

(52) U.S. Cl.
CPC .... *C23C 16/45565* (2013.01); *C23C 16/4412* (2013.01); *C23C 16/458* (2013.01);
(Continued)

(58) Field of Classification Search
USPC .................. 118/715–733; 156/345.1–345.55
See application file for complete search history.

(56) References Cited

U.S. PATENT DOCUMENTS

| | | |
|---|---|---|
| 4,585,515 A | 4/1986 | Maa |
| 4,585,516 A | 4/1986 | Corn et al. |
| | (Continued) | |

FOREIGN PATENT DOCUMENTS

| | | |
|---|---|---|
| JP | 06053176 | 2/1994 |
| JP | 08306663 A | 11/1996 |
| | (Continued) | |

OTHER PUBLICATIONS

Taiwan Office Action for Application No. 98107031 dated Mar. 2, 2015.

*Primary Examiner* — Parviz Hassanzadeh
*Assistant Examiner* — Tiffany Z Nuckols
(74) *Attorney, Agent, or Firm* — Patterson + Sheridan LLP

(57) ABSTRACT

An apparatus and method are provided for controlling the intensity and distribution of a plasma discharge in a plasma chamber. In one embodiment, a shaped electrode is embedded in a substrate support to provide an electric field with radial and axial components inside the chamber. In another embodiment, the face plate electrode of the showerhead assembly is divided into zones by isolators, enabling different voltages to be applied to the different zones. Additionally, one or more electrodes may be embedded in the chamber side walls.

20 Claims, 7 Drawing Sheets

Related U.S. Application Data continuation of application No. 12/052,431, filed on Mar. 20, 2008, now abandoned.

(51) Int. Cl.

| | | |
|---|---|---|
| *C23C 16/44* | (2006.01) | |
| *C23C 16/503* | (2006.01) | |
| *C23C 16/505* | (2006.01) | |
| *H01J 37/32* | (2006.01) | |
| *C23C 16/509* | (2006.01) | |

(52) U.S. Cl.
CPC ........ *C23C 16/4586* (2013.01); *C23C 16/503* (2013.01); *C23C 16/505* (2013.01); *C23C 16/5096* (2013.01); *H01J 37/32091* (2013.01); *H01J 37/32165* (2013.01); *H01J 37/32532* (2013.01); *H01J 37/32541* (2013.01)

(56) References Cited

U.S. PATENT DOCUMENTS

| | | | |
|---|---|---|---|
| 4,692,836 A * | 9/1987 | Suzuki | H01L 21/6831 279/128 |
| 5,304,250 A | 4/1994 | Sameshima et al. | |
| 5,414,324 A | 5/1995 | Roth et al. | |
| 5,464,499 A | 11/1995 | Moslehi et al. | |
| 5,573,981 A | 11/1996 | Sato | |
| 5,688,331 A | 11/1997 | Aruga et al. | |
| 5,737,175 A | 4/1998 | Grosshart et al. | |
| 5,914,568 A | 6/1999 | Nonaka | |
| 6,110,556 A | 8/2000 | Bang et al. | |
| 6,136,214 A | 10/2000 | Mori et al. | |
| 6,228,438 B1 * | 5/2001 | Schmitt | C23C 16/4583 118/723 E |
| 6,488,820 B1 | 12/2002 | Burkhart | |
| 6,596,550 B2 * | 7/2003 | Sill | H01J 37/321 216/61 |
| 6,663,748 B2 | 12/2003 | Kodama | |
| 7,144,521 B2 | 12/2006 | Rusu et al. | |
| 7,651,586 B2 | 1/2010 | Moriya et al. | |
| 7,683,289 B2 | 3/2010 | Dhindsa et al. | |
| 8,069,817 B2 | 12/2011 | Fischer et al. | |
| 8,563,619 B2 | 10/2013 | Dhindsa et al. | |
| 2002/0094591 A1 | 7/2002 | Sill et al. | |
| 2003/0121886 A1 | 7/2003 | Strang et al. | |
| 2005/0133162 A1 | 6/2005 | Tetsuka et al. | |
| 2006/0219363 A1 | 10/2006 | Matsumoto et al. | |
| 2007/0023398 A1 | 2/2007 | Kobayashi et al. | |
| 2007/0113785 A1 | 5/2007 | Ho | |
| 2007/0227663 A1 * | 10/2007 | Endoh | H01J 37/32477 156/345.47 |
| 2008/0041889 A1 | 2/2008 | Geier | |
| 2008/0084650 A1 * | 4/2008 | Balasubramanian | C23C 16/52 361/234 |
| 2008/0142481 A1 | 6/2008 | White et al. | |
| 2008/0180357 A1 | 7/2008 | Kawakami et al. | |
| 2009/0044910 A1 * | 2/2009 | Osada | C23C 16/26 156/345.43 |
| 2009/0090695 A1 | 4/2009 | Kadkhodayan et al. | |
| 2009/0101284 A1 * | 4/2009 | Higuma | H01J 73/32532 156/345.51 |
| 2009/0236214 A1 * | 9/2009 | Janakiraman | C23C 16/45565 204/164 |
| 2012/0250212 A1 * | 10/2012 | Kimura | C04B 35/63456 361/234 |

FOREIGN PATENT DOCUMENTS

| | | |
|---|---|---|
| JP | 10321604 A | 12/1998 |
| JP | 2000-306891 A | 11/2000 |
| JP | 2001-096931 A | 4/2001 |
| JP | 2002241945 A | 8/2002 |
| KR | 20050053076 A | 6/2005 |
| KR | 20080041889 A | 5/2008 |
| TW | 511398 B | 11/2002 |
| TW | 561515 B | 11/2003 |
| TW | 589675 B | 6/2004 |
| TW | 200520012 A | 6/2005 |
| TW | 200713389 A | 4/2007 |
| TW | 200729272 A | 8/2007 |
| TW | 200807552 A | 2/2008 |
| TW | 200920192 A | 5/2009 |

\* cited by examiner

TUNABLE GROUND PLANES IN PLASMA CHAMBERS

CROSS-REFERENCE TO RELATED APPLICATIONS

This application is a continuation of co-pending U.S. patent application Ser. No. 13/456,308, filed Apr. 26, 2012, and published as United States Patent Publication 2012/0205046, which is a continuation of copending U.S. patent application Ser. No. 12/052,431 filed Mar. 20, 2008, and published Sep. 24, 2009, as United States Patent Publication 2009/0236214, each of which is incorporated herein by reference.

BACKGROUND

Field

Embodiments of the present invention generally relate to an apparatus and method for depositing or removing materials on a substrate. More particularly, embodiments of the present invention relate to an apparatus and method for controlling the intensity and/or distribution of a plasma discharge in a plasma chamber.

Description of the Related Art

Plasma enhanced processes, such as plasma enhanced chemical vapor deposition (PECVD) processes, high density plasma chemical vapor deposition (HDPCVD) processes, plasma immersion ion implantation processes, and plasma etch processes, have become common processes used in depositing materials on substrates and/or removing materials from a substrate to form structures.

Plasma provides many advantages in manufacturing semiconductor devices. For example, using plasma enables a wide range of applications due to lowered processing temperature, enhanced gap-fill for high aspect ratio gaps, and higher deposition rates.

A challenge that is present in conventional plasma processing systems is the control of the plasma to attain uniform etching and deposition. A key factor in the etch rate and deposition uniformity is the spatial distribution of the plasma during processing. For example, in a conventional PECVD chamber, which are typically parallel plate reactors, the traditional factors affecting the spatial distribution of the plasma are chamber pressure, distance between electrodes, and chemistry, among other factors. While conventional control of plasma distribution in PECVD chambers produces satisfactory results, the process may be improved. One challenge that remains in plasma processing is non-uniformity or uneven deposition of bulk material, such as conductive materials, dielectric materials, or semiconductive materials, to form a thin film on the substrate.

FIG. 1A (prior art) is a cross-sectional view of a substrate 1 illustrating one challenge caused, at least in part, by non-uniformity in conventional plasma chambers. The substrate 1 includes a plurality of structures 5, which may be trenches, vias, and the like, formed therein. A layer 10 of conductive, dielectric, or semiconductive material formed thereon by a conventional plasma process substantially covers the substrate 1 and fills the structures 5. The substrate 1 has a dimension $D_1$, which may be a length or width in the case of a rectangular substrate, or an outside diameter in the case of a round substrate. In this example, substrate 1 is a round substrate and dimension $D_1$ is an outside diameter, which may be equal to about 300 mm or 200 mm.

As stated above, the layer 10 substantially covers the substrate 1 but effectively stops at a dimension $D_2$, which leaves a peripheral portion of the substrate 1 having little or no material thereon. In one example, if dimension $D_1$ is 300 mm, dimension $D_2$ may be about 298 mm, which produces about a 1 mm portion around the periphery of the substrate 1 having little or no material thereon, which reduces device yield on the substrate 1 as the periphery of the substrate 1 is effectively unusable. Such defects are sometimes referred to as edge effects or plasma edge effects.

FIG. 1B (prior art) is an exploded cross-sectional view of substrate 1 of FIG. 1A showing a surface area 20 on the periphery of the substrate 1 illustrating another challenge caused, at least in part, by non-uniformity in conventional plasma chambers. The edge region 25 is shown uncovered due to the device yield reduction described above. In addition, conventional plasma processes may produce region 15 along the periphery of the substrate, which may be an area where excessive deposition and build-up of material occurs. In subsequent processes, substrate 1 may undergo a chemical mechanical polishing (CMP) process or other planarization or polishing process to remove a portion of layer 10. In the subsequent process, region 15 may create challenges since region 15 must be removed along with layer 10. As region 15 may include a height $D_3$ of between a few hundred angstroms (Å) to thousands of Å above surface area 20 of layer 10, throughput may be negatively impacted in the subsequent process. Additionally, removal of region 15 may cause overpolishing of surface area 20, which may result in damage to devices or structures formed on substrate 1.

Therefore, there is a need for an apparatus and method to provide enhanced control of the spatial distribution of plasma in a plasma chamber to address the challenges described above.

SUMMARY OF THE INVENTION

Embodiments described herein generally provide methods and apparatus for controlling the spatial distribution of a plasma in a plasma chamber using a secondary ground plane.

One embodiment provides an apparatus for processing a substrate, comprising a substrate support; one or more electrodes coupled to the substrate support; a showerhead assembly having a face plate opposing the substrate support; and one or more ground elements spaced radially away from the substrate support, wherein the substrate support and the face plate cooperatively define a processing volume and the one or more electrodes are adapted to generate a tunable electric field inside the processing volume having axial and radial components.

Another embodiment provides an apparatus for supporting a substrate in a processing chamber, comprising a support surface; a thermal control element disposed within the support surface; an electrode disposed within the support surface, wherein the electrode has a first portion defining a first plane and a second portion defining an angled surface, and the angled surface intersects the first plane; and a tuner coupled to the electrode.

Another embodiment provides a method of controlling the spatial distribution of a capacitively coupled plasma, comprising positioning a first electrode inside a processing chamber, positioning a first ground plane inside the processing chamber and facing the first electrode to define a processing volume, and generating an electric field with axial and radial components inside the processing volume by application of RF power to the first electrode and DC power to the first ground plane.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 1A:
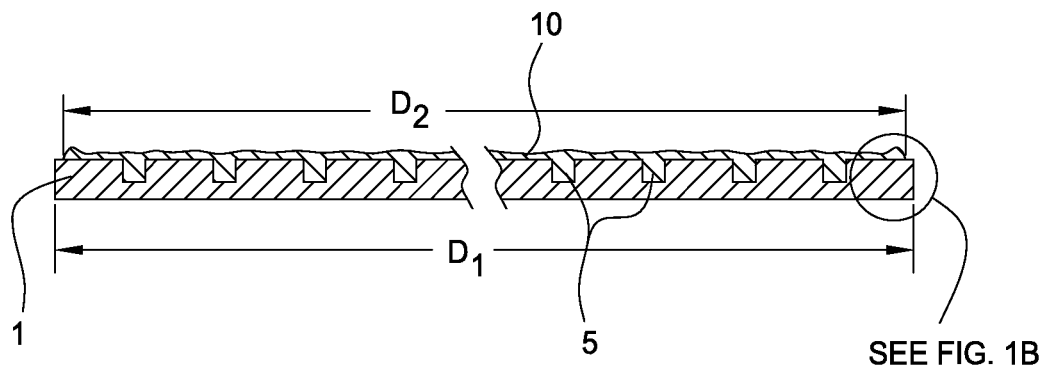
FIG. 1A (prior art) is a cross-sectional view of a substrate treated according to a prior art process.

To facilitate understanding, identical reference numerals have been used, wherever possible, to designate identical elements that are common to the figures. It is also contemplated that elements disclosed in one embodiment may be beneficially utilized on other embodiments without specific recitation.

DETAILED DESCRIPTION

The present invention generally provides methods and apparatus for controlling the spatial distribution of a plasma during processing of a substrate in a plasma reactor having a plasma generator with parallel electrodes.

Figure 2A:
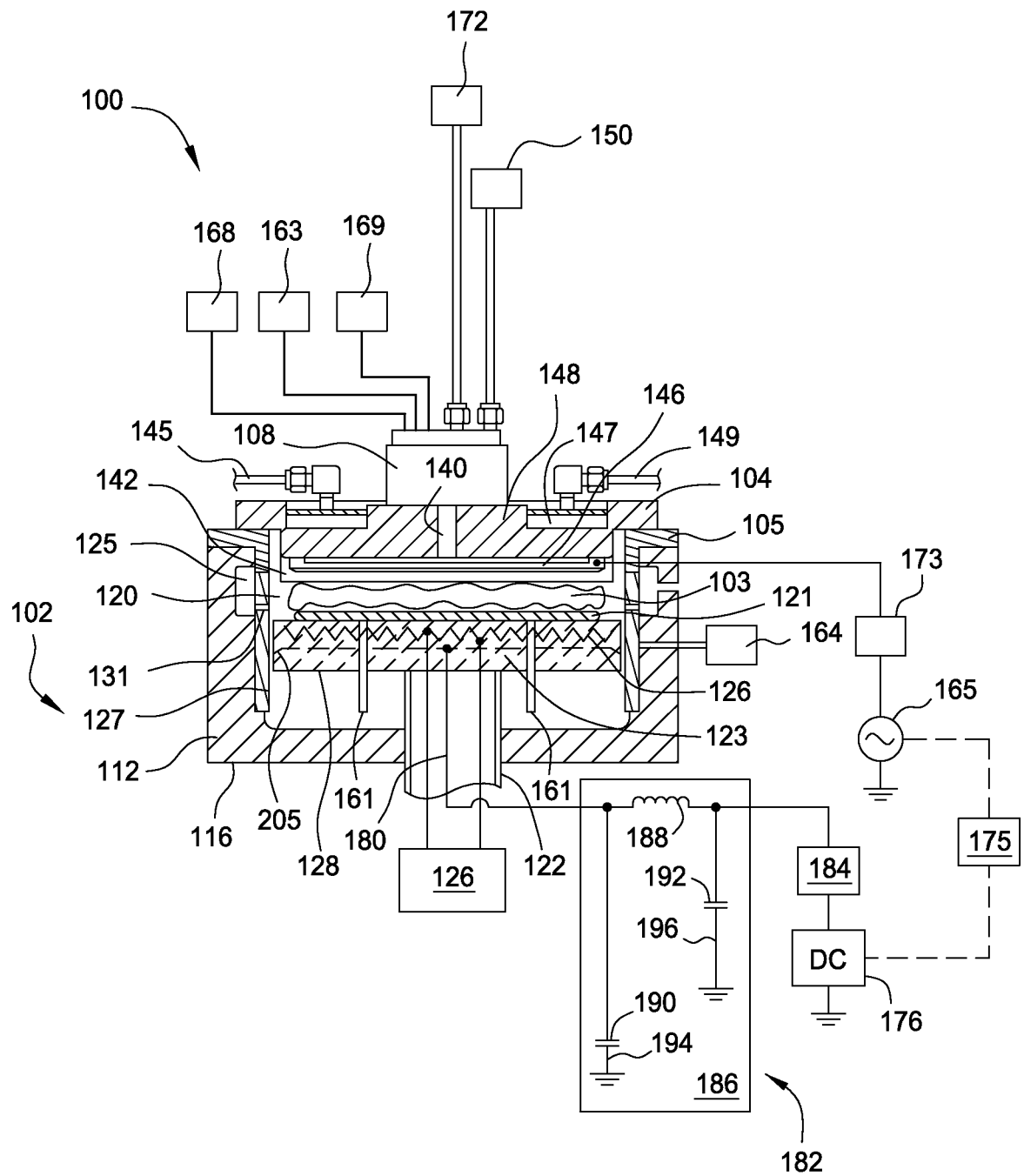
FIG. 2A is a schematic cross-sectional view of a plasma processing chamber in accordance with one embodiment of the present invention.

FIG. 2A is a schematic cross-sectional view of one embodiment of a plasma enhanced chemical vapor deposition (PECVD) system 100. The PECVD system 100 generally comprises a chamber body 102 supporting a chamber lid 104 which may be attached to the chamber body 102 by one or more fasteners, such as screws, bolts, hinges, and the like. The chamber body 102 comprises chamber sidewall 112 and a bottom wall 116 defining a processing volume 120 for containing a plasma 103 between a substrate support 128 and a showerhead assembly 142. A controller 175 is coupled to the system 100 to provide process control, such as gas delivery and exhaust, transfer functions, among other functions.

The chamber lid 104 is coupled to a gas distribution system 108 for delivering reactant and cleaning gases into the processing volume 120 via the shower head assembly 142. The shower head assembly 142 includes a gas inlet passage 140 which delivers gas into the processing volume 120 from one or more gas inlets 168, 163, and 169. A remote plasma source (not shown) may be coupled between the processing volume 120 and the gas inlets 168, 163, and 169. The PECVD system 100 may also include a liquid delivery source 150 and a gas source 172 configured to provide a carrier gas and/or a precursor gas. A circumferential pumping channel 125 formed in the sidewall 112 and coupled to a pumping system 164 is configured for exhausting gases from the processing volume 120 and controlling the pressure within the processing volume 120. A chamber liner 127, preferably made of ceramic or the like, may be disposed in the processing volume 120 to protect the sidewall 112 from the corrosive processing environment. A plurality of exhaust ports 131 may be formed on the chamber liner 127 to couple the processing volume 120 to the pumping channel 125.

A base plate 148 integrates the chamber lid 104, gas distribution system 108 and shower head assembly 142. A cooling channel 147 is formed in the base plate 148 to cool the base plate 148 during operation. A cooling inlet 145 delivers a coolant fluid, such as water or the like, into the cooling channel 147. The coolant fluid exits the cooling channel 147 through a coolant outlet 149.

The substrate support 128 is configured for supporting and holding a substrate 121 during processing. The substrate support 128 is adapted to move vertically within the processing volume 120, and may additionally be configured to rotate by a drive system coupled to a stem 122. Lift pins 161 may be included in the substrate support 128 to facilitate transfer of substrates into and out of the processing volume 120. In one embodiment, the substrate support 128 includes at least one electrode 123 to which a voltage is applied to electrostatically secure the substrate 121 thereon. The electrode 123 is powered by a direct current (DC) power source 176 connected to the electrode 123. Although the substrate support 128 is depicted as a monopolar DC chuck, embodiments described herein may be used on any substrate support adapted to function as a ground plane in a plasma chamber and may additionally be a bipolar chuck, a tripolar chuck, a DC chuck, an interdigitated chuck, a zoned chuck, and the like.

The substrate support 128 may comprise heating elements 126, for example resistive heating elements, to heat the substrate 121 positioned thereon to a desired process temperature. The heating elements 126 may be coupled to an alternating current (AC) power supply (not shown) configured to provide a voltage, such as about 208 volts to the heating elements 126.

A radio frequency (RF) power source 165 is coupled to the showerhead assembly 142 through an impedance matching circuit 173. The faceplate 146 of the showerhead assembly 142 and the electrode 123, which may be grounded via an electronic filter, such as a capacitor 190, form a capacitive plasma generator. The RF source 165 provides RF energy to the showerhead assembly 142 to facilitate generation of a capacitive plasma between the faceplate 146 of the showerhead assembly 142 and the substrate support 128. Thus, the electrode 123 provides both a ground path for the RF source 165 and an electrical bias from DC power source 176 to enable electrostatic clamping of the substrate 121.

The substrate support 128 generally comprises a body made of a ceramic material, such as aluminum oxide ($Al_2O_3$), aluminum nitride (AlN), silicon dioxide ($SiO_2$), or other ceramic materials. In one embodiment, the body of the substrate support 128 is configured for use at a temperature in the range of about −20° C. to about 700° C. The electrode 123 may be a mesh, such as an RF mesh, or a perforated sheet of material made of molybdenum (Mo), tungsten (W), or other material with a substantially similar coefficient of expansion to that of the ceramic material comprising the body of the substrate support 128. The electrode 123 embedded in substrate support 128, together with faceplate 146 of showerhead assembly 142, cooperatively define processing volume 120.

The RF source 165 may comprise a high frequency radio frequency (HFRF) power source, for example a 13.56 MHz RF generator, and a low frequency radio frequency (LFRF) power source, for example a 300 kHz RF generator. The LFRF power source provides both low frequency generation and fixed match elements. The HFRF power source is designed for use with a fixed match and regulates the power delivered to the load, eliminating concerns about forward and reflected power.

The electrode 123 is coupled to a conductive member 180. The conductive member 180 may be a rod, a tube, wires, or the like, and be made of a conductive material, such as molybdenum (Mo), tungsten (W), or other material with a substantially similar coefficient of expansion with other materials comprising the substrate support 128. The electrode 123 functions as a return path for RF power and a biasing electrode to enable electrostatic chucking of the substrate. In order to provide an electrical bias to the substrate 121, the electrode 123 is in communication with a power supply system 182 that supplies a biasing voltage to the electrode 123. The power supply system 182 includes DC power source 176 to supply a DC signal to the electrode 123 and an electronic filter 186 adapted to filter voltage fluctuations between DC power source 176 and electrode 123. In one embodiment, DC power source 176 is a 24 volt DC power supply and the electrical signal may provide a positive or negative bias.

DC power source 176 may be coupled to an amplifier 184 to amplify the electrical signal from DC power source 176. Voltage fluctuations are filtered by electronic filter 186 to prevent DC power source 176 and amplifier 184 from suffering voltage spikes. In one embodiment, filter 186 may be an inductor 188 with capacitors 190 and 192 in parallel. The amplified and filtered electrical signal is provided to the electrode 123 and the substrate 121 to enable electrostatic clamping of the substrate 121. Capacitors 190 and 192 also allow electrode 123 to function as a ground member for RF power, wherein RF power is coupled to ground by connectors 194 and 196. Capacitors 190 and 192 prevent DC power from DC power source 176 from going to ground, while passing RF power. In one embodiment, the capacitors 190 and 192 may each be 0.054 micro Farad (µF) capacitors at 10-15 amps and about 2000 volts. In this manner, the electrode 123 functions as a substrate biasing electrode and a return electrode for RF power.

As described above, the electrode 123 provides a bias from DC power source 176 and functions as a ground path for RF energy from RF power source 165. The capacitively coupled plasma 103 generated in the processing volume 120 may be tuned by the matching circuit 173 based on signals from the controller 175. However, the configuration of the electrode 123, in its function as a ground plane for RF energy, may not provide an acceptable plasma discharge or spatial distribution. For example, the periphery of the substrate 121 may encounter only intermittent plasma discharge, which results in incomplete or reduced deposition at the periphery. In another example in reference to FIGS. 1A and 1B, the periphery of the plasma 103 may produce a region 15 along the periphery of the substrate, which may be an area where excessive deposition and build-up of deposited material occurs on the substrate 121.

Figure 1B:
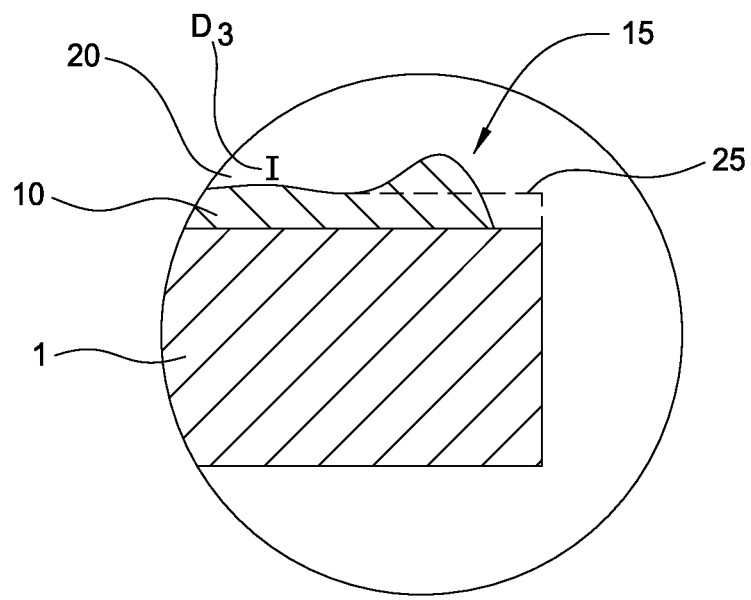
FIG. 1B (prior art) is a detail view of the substrate of FIG. 1A.

In the embodiment illustrated by FIG. 2A, the electrode 123 may be shaped to counteract plasma edge effects described in connection with FIGS. 1A and 1B. Angling the periphery of the electrode 123, as shown in this embodiment, results in generation of an electric field having radial as well as axial components inside the processing volume 120. The potential difference between the electrode 123 and the face plate 146 is different at different points on the electrode 123. These potential differences result in electrostatic forces that push charged particles from the face plate 146 to the electrode 123, the axial component of the electric field, and closer to or further from the center of the chamber, the radial component of the electric field. Additionally, the electrode 123 may be tuned by adjusting DC power to the electrode based on signals from the controller 175. In this way, the ground plane for the plasma generator, exemplified in this embodiment by the electrode 123, is tunable and allows for mitigation of plasma edge effects.

Figure 2B:
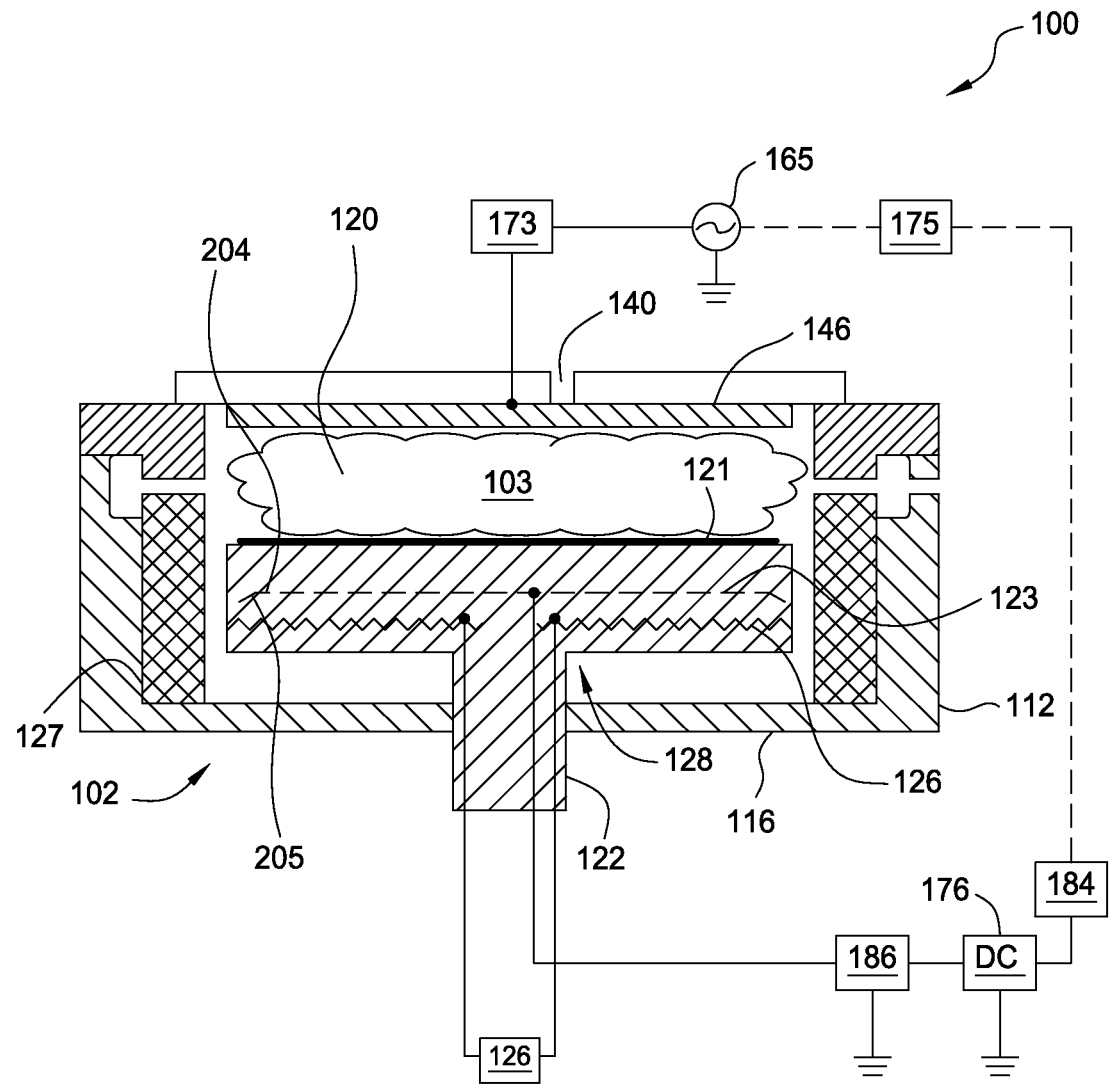
FIG. 2B is a schematic side view of the plasma processing chamber of FIG. 2A.

FIG. 2B is another schematic side view of the plasma processing chamber of FIG. 2A, showing the electrode 123 more distinctly within the substrate support 128. The electric field creates a plasma 103 by capacitive coupling of a process gas provided to a processing volume 120 through the face plate 146. In this embodiment, the electrode 123 features a flat portion 204 and an angled portion 205. The flat portion 204 of the electrode 123 comprises a first portion that defines a plane, and the angled portion 205 comprises a second portion that defines a surface. The substrate support 128 defines a second plane. In this embodiment, the first plane defined by the flat portion 204 and the second plane defined by the substrate support 128 are substantially parallel, while the first plane intersects the surface defined by the angled portion 205. In this way, the electrode 123 exhibits a three-dimensional structure that results in an electric field with radial and axial components. The angled portion 205 of the electrode 123 curves the electric field lines within the processing volume 120 in a way that spreads plasma 103 to cover a substrate 121 disposed on the substrate support 128 more completely.

For embodiments featuring an electrode 123 with an angled edge, as illustrated by FIG. 2B, the angled portion 205, in cross-section, will form an angle with the flat portion 204 that is preferably between about 90° and about 170°, such as about 135°. In the embodiment shown in FIG. 2B, the angled portion 205 of the electrode 123 thus forms an obtuse angle with the flat portion 204, and is angled away from the surface of the substrate support 128. In other embodiments, the angled portion 205 may be angled toward the surface of the substrate support 128, or may be curved toward or away from the surface of the substrate support 128. In some embodiments, the edges of the electrode 123 may extend beyond the edges of a substrate disposed on the substrate support 128. In other embodiments, the edges of a substrate may extend beyond the edges of the substrate support 128 and the electrode 123. In still other embodiments, the electrode 123 is embedded in the substrate support 128 at a depth such that the distance between the flat portion 204 of the electrode 123 and the surface of the substrate support 128 is between about 5 and 10 mm. In some embodiments, the angled portion 205 may be configured such that the end of the angled portion 205 furthest from the flat portion 204 is between about 25% and about 50% further from the surface of the substrate support 128 than the flat portion 204. In other embodiments, the portion of the substrate support 128 extending beyond the edge of the electrode 123 may be between about 1 mm and about 3 mm in width.

In other embodiments, portion 205 is an edge portion and portion 204 is a central portion of electrode 123. Portion 205 may be raised or lowered relative to portion 204 such that portions 204 and 205 define planes which are substantially parallel, but portion 205 may be closer to, or further from, the surface of substrate support 128. In some embodiments, portion 205 may be displaced from portion 204 between about 0.5 mm and about 2 mm. There may be a sloped portion joining portions 204 and 205, which may form angles with portions 204 and 205, or may form curved joints with portion 204 and 205.

Additionally, portion 205, whether angled or not with respect to portion 204, may have a thickness that is more or less than portion 204. The thickness of portion 205 may deviate from that of portion 204 by up to about 0.5 mm, such that portion 205 is up to 0.5 mm thinner than portion 204, or portion 205 is up to 0.5 mm thicker than portion 204. The thickness of either portions 204 or 205 may also be tapered. For example, portion 205 may be up to about 3 mm. thick where it joins portion 204, and may taper to a thickness of 0.5 mm or less at its edge. Portion 205 may likewise be fitted with a shaped edge, such as a bead with shaped cross-section, such as a circular bead attached to the edge of portion 205. The bead may have any advantageous shape in cross section, such as triangular, square, or trapezoidal.

Figure 3:
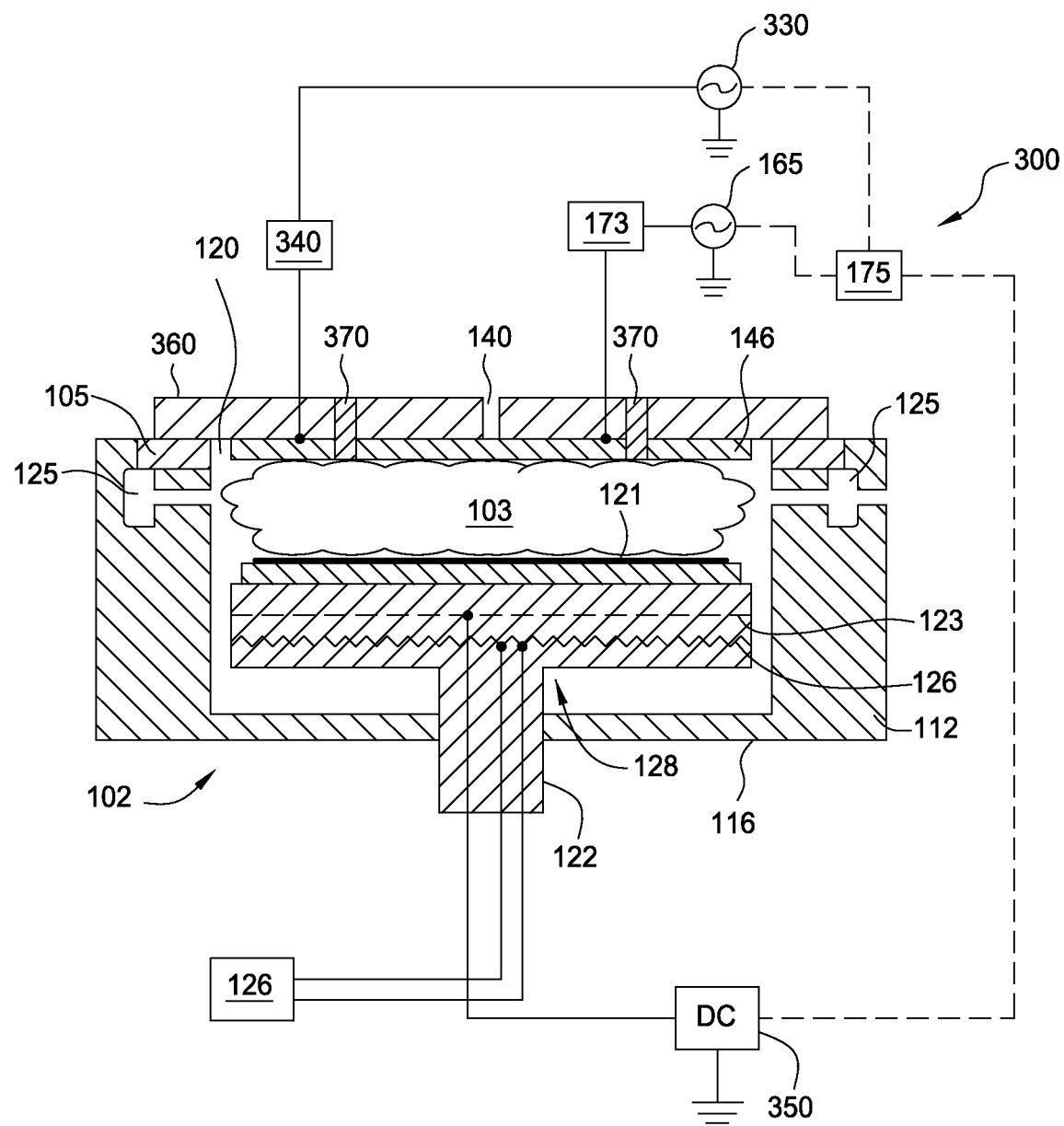
FIG. 3 is a schematic side view of another embodiment of a plasma processing chamber according to the present invention.

FIG. 3 is a schematic side-view of a plasma processing chamber according to another embodiment. In this embodiment, chamber 300 features a zoned showerhead assembly 360. The face plate 146 of the showerhead assembly 360 is separated into discrete conductive zones by electrical isolators 370. In one embodiment, RF power is applied to each zone separately by independent RF sources 165 and 330 through independent matching networks 173 and 340, respectively, all under control of a controller 175. In another embodiment, a single RF source provides power to each zone, or to all zones collectively. A voltage bias is applied to the electrode 123, as described above, with the DC biasing source collectively represented by element 350, which may include filters, such as filter 186, and amplifiers, such as amplifier 184, as described above, and is coupled to the electrode 123 by a connector. The zoned showerhead assembly 360 is coupled to the independent RF sources 165 and 330, which allows different power levels to be applied to the zones through the independent impedance matching networks 173 and 340 to tune the electric field inside the processing volume 120 to control the spatial distribution of plasma 103.

Figure 4:
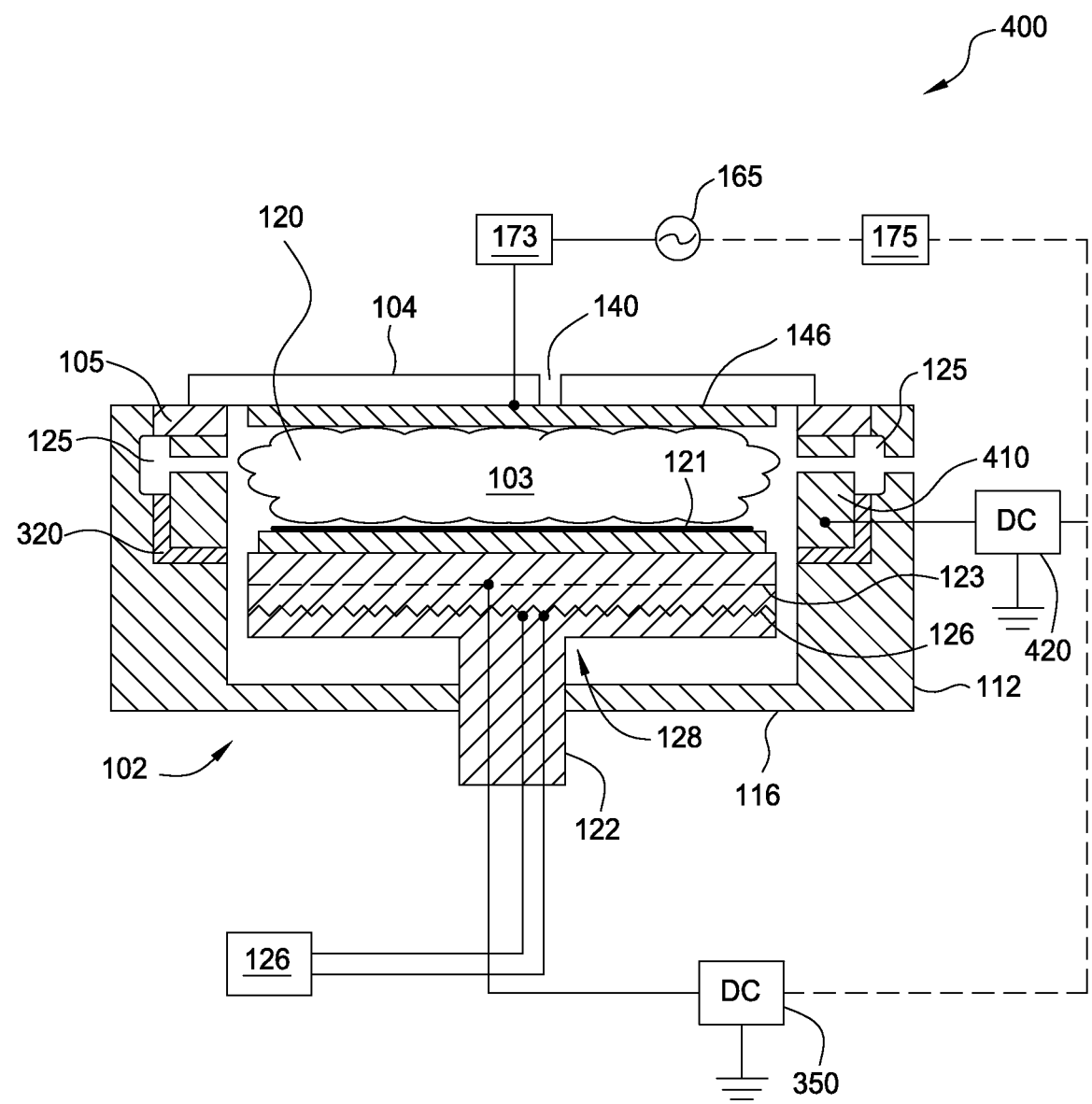
FIG. 4 a schematic side view of another embodiment of a plasma processing chamber according to the present invention.

FIG. 4 is a schematic side-view of a plasma processing chamber according to another embodiment of the invention. In this embodiment, a chamber 400 utilizes an electrode 410 embedded in the chamber sidewall 112. The chamber wall electrode 410 is made of a suitable conductive material, such as aluminum, and is isolated from the sidewall 112 by an isolator 320 and from chamber lid 104 by an isolator 105. Each isolator may be made of any suitable insulating material, but is preferably made of a material with thermal characteristics similar to the materials of the chamber wall. One such material is ceramic. In this embodiment, a voltage bias is applied to the electrode 123 as above, with DC source, amplifiers, and filters, as described above in reference to FIG. 2A, collectively represented by DC element 350, which is coupled to the electrode 123 by a connector. A similar bias generator 420 may be coupled to the chamber wall electrode 410. The controller 175 may be adapted to control application of RF power to the face plate 146, bias power to the electrode 123, and bias power to the chamber wall electrode 410 to ensure adequate coverage of a substrate 121 by plasma 103.

Figure 5:
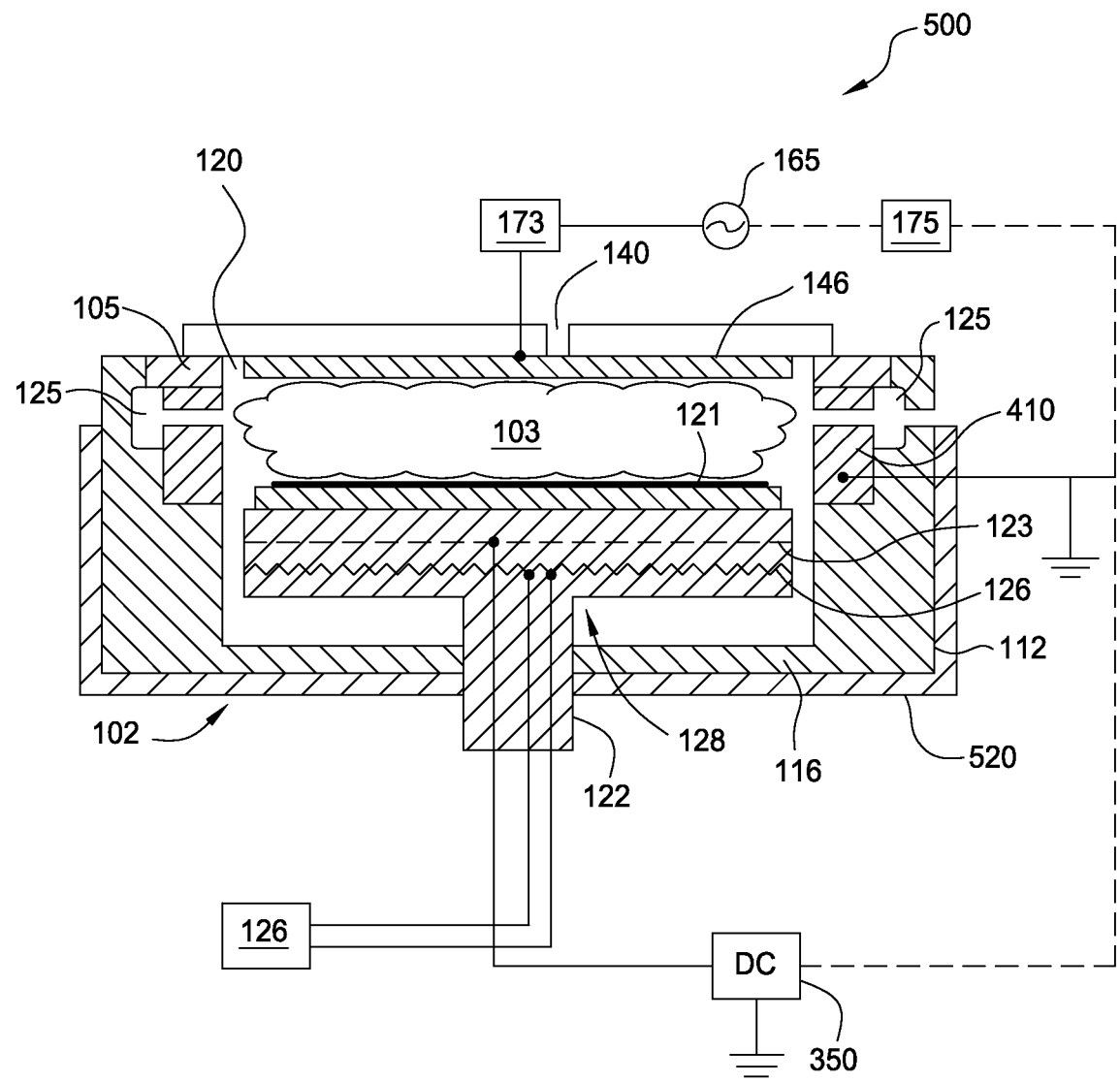
FIG. 5 is a schematic side view of another embodiment of a plasma processing chamber according to the present invention.

FIG. 5 is a schematic side-view of a plasma processing chamber 500 according to another embodiment of the invention. In this embodiment, the chamber wall electrode 410 is not isolated from the sidewall 112, so plasma 103 may couple directly with the chamber wall, as well as with the electrode 123, such that the chamber wall electrode 410, the sidewall 112, and the electrode 123 collectively serve as ground planes. DC bias applied to the chamber wall electrode 410 is thus applied to the entire chamber wall, causing plasma 103 to spread toward the periphery of the processing volume 120 and cover the substrate 121. An insulator 520 is provided to prevent electric discharges from the sidewall 112, and an isolator 105 isolates a lid assembly 148 from the rest of the chamber.

Figure 6:
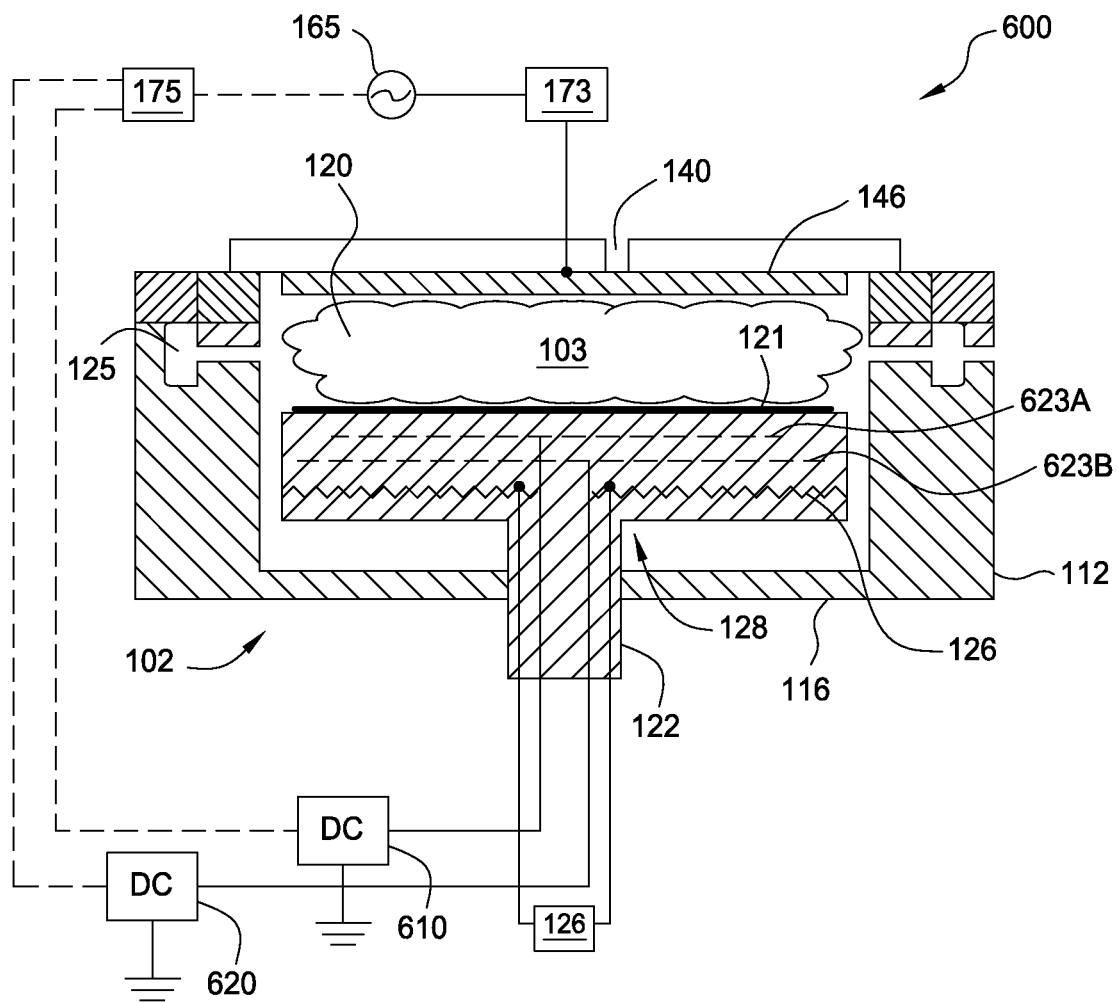
FIG. 6 is a schematic side view of another embodiment of a plasma processing chamber according to the present invention.

FIG. 6 is a schematic side-view of a plasma processing chamber 600 according to another embodiment of the invention. In this embodiment, two electrodes 623A and 623B are embedded within the substrate support 128. As before, each electrode is configured to serve as a ground plane for RF power, while applying DC voltage bias to clamp a substrate 121 in place. Each electrode is separately biased by DC bias generators 610 and 620, respectively. As before, each DC bias generator comprises a DC source with amplifiers and filters as necessary. The ability to tune the ground planes independently provides the capability to shape the electric field inside the processing volume 120 to control the spatial distribution of plasma 103 to minimize or eliminate plasma edge effects.

The embodiments described above are examples incorporating elements of the invention in demonstrable ways. Any combination of the above elements may be used to tune and shape plasma 103 inside the processing volume 120 for complete coverage of a substrate 121 without edge effects. Any combination of multiple electrodes, shaped or unshaped ground members, bias generators, isolators, and the like, may be used. For example, multiple shaped ground members, or a single shaped ground member with a sidewall electrode, may be used. A zoned showerhead electrode may also be used with one or more shaped ground members, and with one or more sidewall electrodes.

In operation, a substrate is disposed on a substrate support inside a plasma processing chamber according to any of the embodiments described above. Process gases are supplied to the processing chamber through a showerhead assembly, which comprises a first electrode. RF power is applied to the first electrode by coupling an RF generator through an impedance matching network to the first electrode. The RF generator may generate high-frequency power, such as about 13.56 MHz, or low-frequency power, such as about 300 kHz. Application of RF power to the first electrode creates an oscillating electric field inside the processing chamber, and ionizes the process gases into a plasma.

The substrate is disposed on a substrate support with a ground member embedded therein. The ground member serves as an electrode for coupling DC power to the substrate support, and together with the first electrode, defines a processing volume in the processing chamber. DC power is coupled to the electrode using connectors that run through the substrate support. DC power is applied to the electrode, creating a voltage bias in the electrode that results in the substrate being clamped securely to the substrate support. An electronic filter may be provided between the DC power source and the electrode disposed in the substrate support so that the electrode may serve as a path to ground for the RF power, while applying a DC voltage bias to the substrate. In this way, the electrode in the substrate support may serve as a ground member for the RF power. A controller may be used to adjust the power delivered to the plasma by tuning the impedance of the match network. The controller may also be used to adjust the power output of the DC source to tune the electric field inside the processing chamber. In this way, an electric field having radial as well as axial components is generated, allowing adjustment of the spatial distribution of the plasma toward or away from the center of the chamber for full coverage of the substrate.

In this embodiment, the ground member is shaped to produce the desired field properties. For example, the ground member may feature a first portion substantially parallel to the surface of the substrate support, and a second portion tapered from the first portion. The first portion defines a plane, and the second portion defines a surface that intersects the plane. A shaped ground member may thus define a plurality of intersecting surfaces.

In an alternative embodiment, multiple ground members may be provided. For example, a second ground member having a different shape from the first ground member may be embedded inside the substrate support. A controller may separately tune the bias applied to each ground member to create the desired spatial distribution of the plasma.

In another embodiment, a zoned showerhead electrode may be used to generate a tunable electric field. RF power may be provided independently through different match networks to the different zones. A controller may be used to tune the power provided to each zone by adjusting the impedance of the match networks. A DC voltage bias is applied to an electrode embedded in the substrate support to clamp the substrate and provide a path to ground for the RF power, as discussed above. In this embodiment, tuning the power delivery to the different zones of the showerhead electrode results in an electric field having radial as well as axial components, and allows control of the spatial distribution of the plasma.

In an alternative embodiment, the electric field and plasma may be radially adjusted by providing an electrode in the sidewall of the processing chamber. In some embodiments, the chamber wall itself may be used as the electrode. The electrode may be grounded or biased in addition to the electrode embedded in the substrate support. A controller may be used to independently adjust the bias of the substrate support electrode, the sidewall electrode, and the power delivered to the showerhead electrode to adjust the spatial distribution of the plasma.

While the foregoing is directed to embodiments of the present invention, other and further embodiments of the invention may be devised without departing from the basic scope thereof, and the scope thereof is determined by the claims that follow.

The invention claimed is:

1. An apparatus for processing a substrate, comprising:
   a chamber comprising a chamber lid and chamber body that together define a processing volume, wherein the chamber body comprises a sidewall;
   a base plate coupled to the chamber lid;
   a showerhead assembly coupled to the base plate, the showerhead assembly comprising a faceplate configured to be electrically coupled to a radio frequency power source;
   a substrate support disposed within the chamber;
   a pumping channel formed in the sidewall and fluidly coupled to the processing volume by an exhaust port;
   a first electrode embedded within the substrate support, wherein the first electrode has a flat portion and an angled portion, wherein the angled portion is peripheral to the flat portion, wherein the flat portion is substantially parallel to the faceplate and the first electrode is electrically coupled to a ground, wherein the angled portion is angled away from an upper surface of the substrate support, wherein the angled portion extends below a lower surface of the flat portion, and wherein the angled portion forms an obtuse angle with the lower surface of the flat portion;
   a second electrode embedded within the sidewall and electrically coupled to a ground, wherein the exhaust port is formed through the second electrode; and
   an isolator that isolates the second electrode from the sidewall.

2. The apparatus of claim 1, wherein the chamber lid is connected to the chamber body by a hinge, and wherein the angled portion is the outer edge of the first electrode.

3. The apparatus of claim 1, wherein the substrate support further comprises a heating element.

4. The apparatus of claim 1, wherein the angled portion has an end furthest from the flat portion, and wherein the end of the angled portion is a distance of about 25% to about 50% further from the upper surface of the substrate support than the flat portion.

5. The apparatus of claim 1, wherein the first electrode is connected to a first biasing circuit and the second electrode is connected to a second biasing circuit.

6. The apparatus of claim 5, further comprising a third electrode embedded within the substrate support and connected to a third biasing circuit.

7. The apparatus of claim 5, wherein the substrate support is a zoned chuck.

8. The apparatus of claim 1, wherein the substrate support comprises a ceramic material and the first electrode comprises a conductive material, and wherein the ceramic material and the conductive material have substantially similar coefficients of expansion.

9. An apparatus for processing a substrate, comprising:
   a chamber comprising a chamber lid connected to a chamber body by a hinge, wherein the chamber lid and chamber body together define a processing volume, wherein the chamber body comprises a sidewall;
   a base plate coupled to the chamber lid;
   a showerhead assembly coupled to the base plate, the showerhead assembly comprising a faceplate configured to be electrically coupled to a radio frequency power source;
   a substrate support disposed within the chamber, the substrate support comprising a zoned chuck;
   a pumping channel formed in the sidewall and fluidly coupled to the processing volume by an exhaust port;
   a first electrode of the zoned chuck embedded within the substrate support, wherein the first electrode has a flat portion and an angled portion, wherein the angled portion is peripheral to the flat portion, wherein the flat portion is substantially parallel to the face plate and the first electrode is electrically coupled to a ground, wherein the angled portion is angled away from an upper surface of the substrate support, wherein the angled portion extends below a lower surface of the flat portion, and wherein the angled portion forms an obtuse angle with the lower surface of the flat portion;
   a second electrode embedded within the sidewall and electrically coupled to a ground, wherein the exhaust port is formed through the second electrode; and
   an isolator that isolates the second electrode from the sidewall.

10. The apparatus of claim 9, wherein the angled portion has an end furthest from the flat portion, and wherein the end of the angled portion is a distance of about 25% to about 50% further from the upper surface of the substrate support than the flat portion.

11. The apparatus of claim 9, wherein the first electrode is connected to a first biasing circuit and the second electrode is connected to a second biasing circuit.

12. The apparatus of claim 11, further comprising a third electrode embedded within the substrate support and connected to a third biasing circuit.

13. The apparatus of claim 9, wherein the substrate support is an electrostatic chuck.

14. The apparatus of claim 13, further comprising a second isolator between the second electrode and the chamber lid.

15. The apparatus of claim 14, wherein the first electrode is a radio frequency mesh.

16. The apparatus of claim 9, wherein the substrate support comprises a ceramic material and the first electrode comprises a conductive material, and wherein the ceramic material and the conductive material have substantially similar coefficients of expansion.

17. An apparatus for processing a substrate, comprising:
a chamber comprising a chamber lid connected to a chamber body by a hinge, wherein the chamber lid and chamber body together define a processing volume, wherein the chamber body comprises a sidewall;
a base plate coupled to the chamber lid;
a showerhead assembly coupled to the base plate, the showerhead assembly comprising a faceplate configured to be electrically coupled to a radio frequency power source;
a substrate support disposed within the chamber, the substrate support comprising a zoned electrostatic chuck;
a pumping channel formed in the sidewall and fluidly coupled to the processing volume by an exhaust port;
a first electrode of the zoned electrostatic chuck embedded within the substrate support, wherein the first electrode has a flat portion and an angled portion, wherein the angled portion is peripheral to the flat portion, wherein the flat portion is substantially parallel to the face plate and the first electrode is electrically coupled to a ground and to a first biasing circuit, wherein the angled portion is angled away from an upper surface of the substrate support, wherein the angled portion extends below a lower surface of the flat portion, wherein the angled portion forms an obtuse angle with the lower surface of the flat portion, wherein the substrate support comprises a ceramic material and the first electrode comprises a conductive material, and wherein the ceramic material and the conductive material have substantially similar coefficients of expansion;
a second electrode embedded within the sidewall, electrically coupled to a ground, and connected to second biasing circuit, wherein the exhaust port is formed through the second electrode;
a first isolator that isolates the second electrode from the sidewall; and
a second isolator that isolates the second electrode from the chamber lid.

18. The apparatus of claim 17, further comprising a third electrode embedded within the substrate support and connected to a third biasing circuit.

19. The apparatus of claim 18, wherein the first electrode is a radio frequency mesh.

20. The apparatus of claim 19, wherein at least one of the first biasing circuit, the second biasing circuit, and the third biasing circuit is a DC circuit.

* * * * *